United States Patent
Bakalski et al.

(10) Patent No.: US 7,808,079 B2
(45) Date of Patent: Oct. 5, 2010

(54) CIRCUIT ARRANGEMENT AND INTEGRATED CIRCUIT

(75) Inventors: Winfried Bakalski, Munich (DE); Michael Asam, Sainbach (DE); Markus Zannoth, Munich (DE); Krzysztof Kitlinski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 211 days.

(21) Appl. No.: 11/758,953

(22) Filed: Jun. 6, 2007

(65) Prior Publication Data

US 2008/0303165 A1    Dec. 11, 2008

(51) Int. Cl.
  *H01L 23/58*    (2006.01)
(52) U.S. Cl. .............................. 257/584; 257/E23.151
(58) Field of Classification Search .................. 257/150, 257/151, 153, 177, 584, E23.144, E23.151, 257/E23.153, E23.17, E23.175
See application file for complete search history.

(56) References Cited

U.S. PATENT DOCUMENTS

| | | | | |
|---|---|---|---|---|
| 3,596,203 A | * | 7/1971 | Sakamoto et al. | 331/96 |
| 5,559,363 A | * | 9/1996 | Immorlica, Jr. | 257/664 |
| 5,719,530 A | * | 2/1998 | Shimura et al. | 330/286 |

* cited by examiner

*Primary Examiner*—Minh-Loan T Tran
*Assistant Examiner*—Vongsavanh Sengdara
(74) *Attorney, Agent, or Firm*—Eschweiler & Associates, LLC

(57) ABSTRACT

A circuit arrangement includes a plurality of type-identical and identically operated active components, or separate sections of an active component, and includes a branched wiring structure for the interconnection of component connections. In each case the wiring end portions lie between a branching point and an input of different components or sections, wherein the wiring end portions are formed with predetermined geometrical asymmetry with respect to one another in such a way that there is an electrical symmetry of the interconnection configuration between all the connected type-identical components or sections. More particularly, the impedance values between the branching point and the different inputs and outputs are substantially identical.

23 Claims, 4 Drawing Sheets

CIRCUIT ARRANGEMENT AND INTEGRATED CIRCUIT

FIELD OF THE INVENTION

The invention refers to a circuit arrangement and an integrated circuit. More particularly, the invention is directed to a circuit arrangement for reducing asymmetry in electrical parameters of a circuit device such as an RF power circuit.

BACKGROUND OF THE INVENTION

Modern RF power circuits, for instance amplifier circuits for the gigahertz range, in many cases have a circuit structure characterized by a division of highly loaded active components into functional blocks of identical type. Specifically in the case of transistors this is also referred to as a cell structure if, for instance, large emitter/gate areas of RF power transistors are divided into transistor cells which are typically lined up one after another.

In the case of this block or cell structure that has been known for a long time, according to recent insights functional irregularities occur in extreme RF applications and, under certain circumstances, restrict the possibilities for using the corresponding RF circuit arrangements.

Thus, simulation calculations and measurements by means of the method of secondary photon spectroscopy have revealed that the collector current profile in different cells of a transistor connected symmetrically via a wide metal interconnect differs considerably in its temporal dependence relative to one another and/or with respect to the temporal profile of the control voltage.

FIG. 1 schematically shows the wiring structure of such a known transistor arrangement, and FIG. 2 shows a graphical representation of the time dependencies of the collector current for the individual transistor blocks. Details of the graphical representation are not of importance here; the illustration reveals in any case considerable deviations of the temporal dependence from an ideal sinusoidal curve and also between the individual time profiles, which indicates a nonuniform capacity utilization of the overall RF transistor.

Besides the approach of minimizing the resistive component of the lead (as pursued with the wide connection block in accordance with FIG. 1), also known is the approach of constituting the resistive component of the connection wiring as symmetrically as possible by geometrically symmetrical design of the lead portions. This approach is illustrated schematically in FIG. 3, and FIG. 4 shows a time profile of the collector current measured for this wiring structure, under otherwise identical conditions to FIG. 2. Here, too, the details are not of interest—what is striking, however, is the severe deviation from an ideally sinusoidal time profile, which indicates inhomogeneous capacity utilization of the RF power transistor connected in this way.

BRIEF DESCRIPTION OF THE DRAWINGS

Advantages and expediencies of the invention transpire from the following description referred to the figures. Of these.

DETAILED DESCRIPTION OF THE INVENTION

Figure 1:
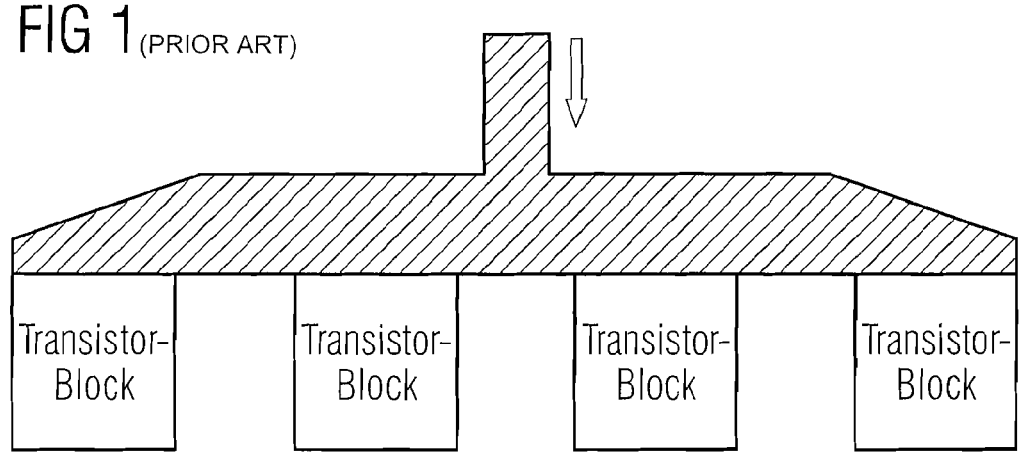
FIG. 1 shows a schematic illustration of a known wiring of an RF power transistor in block structure.
Figure 2:
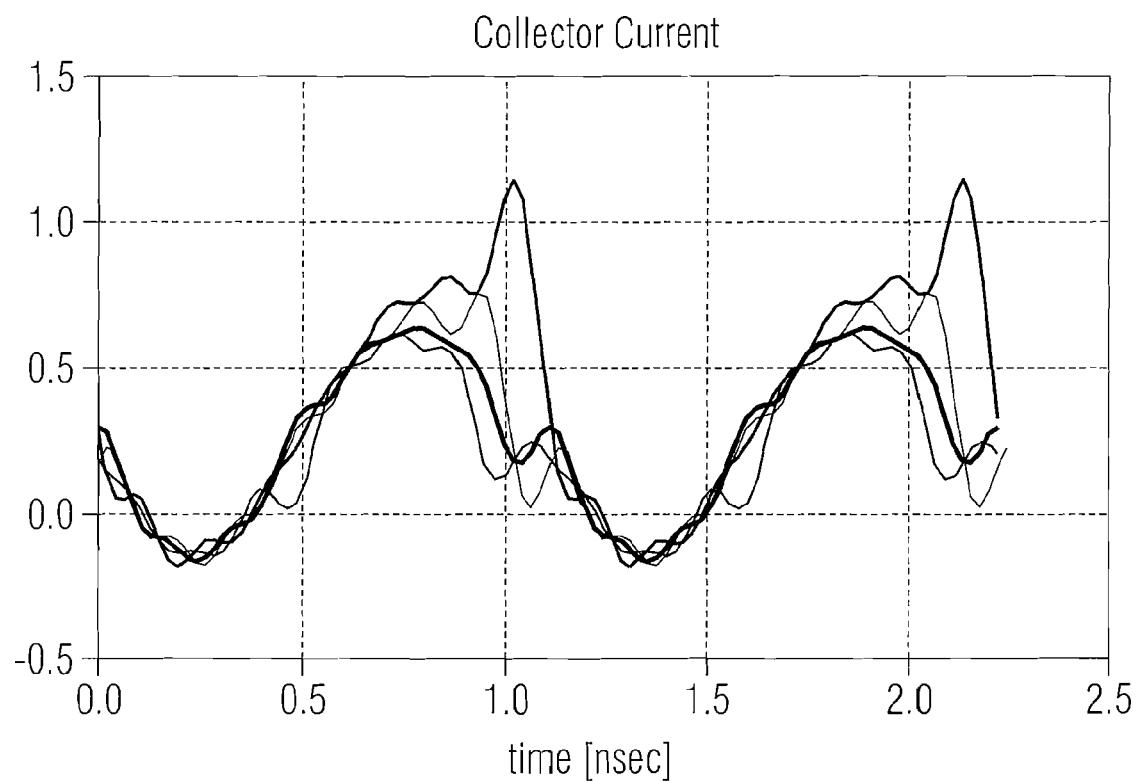
FIG. 2 shows a graphical representation for elucidating the temporal response behavior of the RF power transistor according to FIG. 1.
Figure 3:
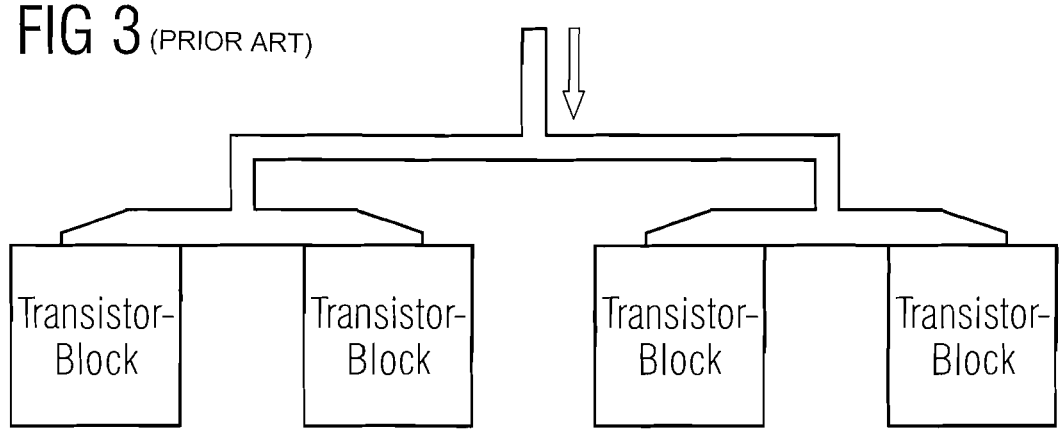
FIG. 3 shows a schematic illustration of a further known wiring of an RF power transistor in block structure.
Figure 4:
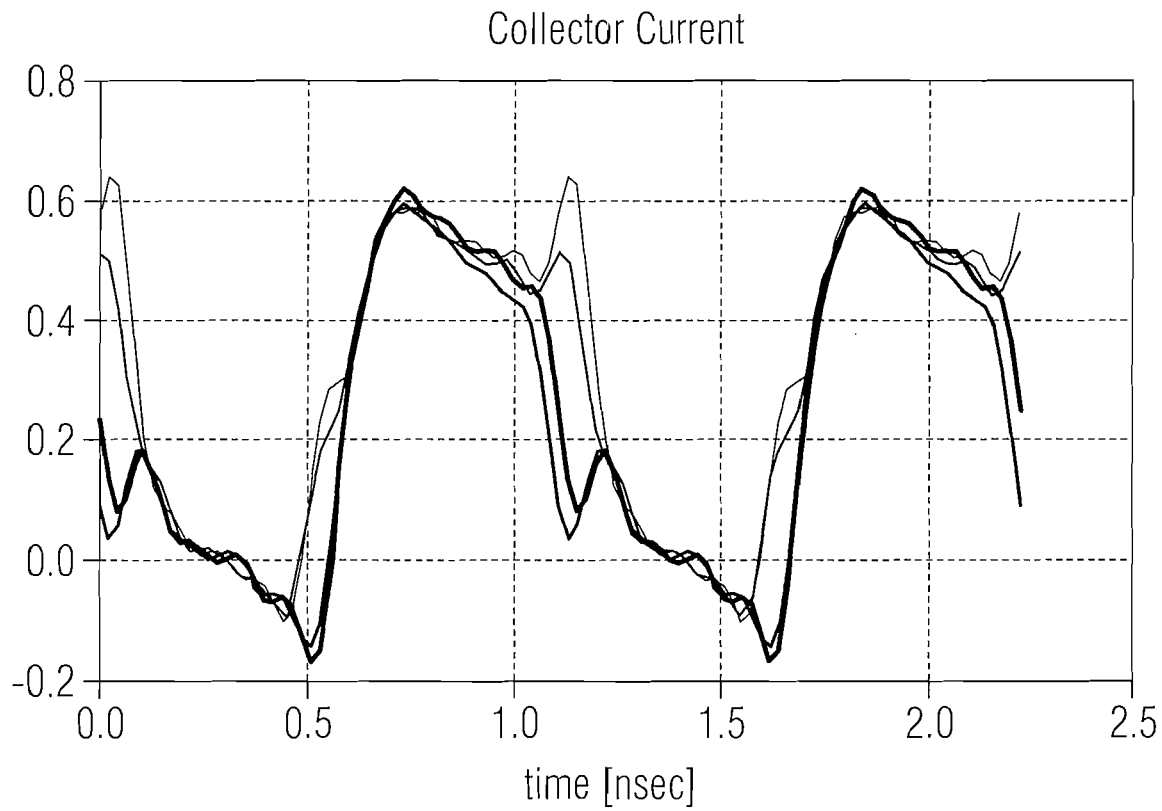
FIG. 4 shows a graphical representation for elucidating the temporal response behavior of the RF power transistor according to FIG. 3.

The invention is directed to a circuit arrangement and an integrated circuit that ensures an improved functionality, in particular an improved capacity utilization of the type-identical (similar) active components or sections of an active component that belong to the circuit.

The invention includes the concept of a targeted geometrical asymmetrization of a branched wiring structure for the interconnection of component connections for the purpose of achieving symmetry in the relevant electrical parameters. In one embodiment, the invention furthermore includes the concept of focusing on symmetrizing the inductive component of the complex impedance of the power end portions. It is advantageous to define a dissimilarity and asymmetry of the geometrical course of the otherwise symmetrically embodied wiring end portions such that, for radio frequency operation of the type-identical components or sections of a component, the inductive component of the impedance at the type-identical component connections is substantially identical. Depending on the specific component configuration and circuit geometry, however, considerations with regard to the capacitive and resistive component are also to be included in the configuration of the predetermined geometrical asymmetry according to one embodiment.

One embodiment of the circuit arrangement takes account of the fact that at least one portion of the wiring end portions lies substantially parallel and adjacent to wiring intermediate portions, whereby an inductance is formed from the corresponding wiring end portions and wiring intermediate portions. In this case, the geometrical asymmetry is determined in such a way that there is symmetry with regard to the inductive components of the complex impedance of the different wiring end portions. In this case, in particular, those wiring end portions which do not run adjacent to a wiring intermediate portion are embodied asymmetrically to a predetermined extent with respect to those wiring end portions which run adjacent to a wiring intermediate portion. This takes account of the formation of inductances between the abovementioned parallel wiring intermediate portions and end portions (which do not occur in the case of those end portions to which no intermediate portion is adjacent).

In a further embodiment of the invention it is provided that conductor cross sections of wiring end portions which are designed asymmetrically for the purpose of symmetrizing their inductive impedance component are chosen differently for the purpose of compensating for a resultant asymmetry of the nonreactive resistance. This therefore involves departing from the earlier concept of symmetrizing the lead geometry with regard to the nonreactive resistance thereof, but nevertheless working toward achieving as far as possible matching nonreactive resistance components in the individual lead branches.

One practically significant realization of this embodiment envisages that wiring end portions of two adjacent active components run from a branching point of the wiring and are embodied with different lengths and, in the longer of the wiring end portions, with a larger conductor cross section, in such a way that the wiring end portions of the adjacent components are inductively and resistively symmetrical.

Also practically significant is an embodiment in which the circuit arrangement has more than two type-identical and identically operated components or sections of a component and a wiring structure multiply branched in treelike fashion for the interconnection of their component connections. The embodiment of the invention can therefore expand from the asymmetrical configuration of wiring end portions to predetermining a suitable asymmetry of lead portions that are further away from the component connections to be supplied. This makes it possible to realize an optimized capacity utilization of a larger number of components or sections of a component, the use of simulation methods becoming increasingly expedient with an increasing number of components or component sections and thus also branching points.

The proposed concept is suitable for circuit arrangements comprising active components that are customary in many cases in RF technology, that is to say which have transistors, in particular FETs, IGBTs, HBTs or HEMTs, or sections thereof and the wiring end portions lead to control inputs of the same.

Up-to-date circuit arrangements of this type are embodied in one embodiment as integrated circuits having a branched interconnect structure on the corresponding metallization levels of the chip. The above explanations correspondingly hold true for such an integrated circuit, in which case attention should be drawn to the special features of realizing the wiring as an interconnect structure of one or a plurality of metallization levels (if appropriate with plated-through holes).

In one embodiment in which the separate sections are transistor blocks of an integrated RF power transistor.

In a first embodiment of a chip structure, four transistor blocks are arranged in a geometrically type-identical configuration in a row alongside one another on a substrate. The interconnect structure has at least a first and second branching point and an end point lying between them, wherein an interconnect intermediate portion runs between the first branching point and the end point and interconnect end portions run between the second branching point and the component connections. At least one of the interconnect end portions runs parallel to the interconnect intermediate portion and forms a mutual inductance with the latter and also a further interconnect portion between the end point and second branching point during operation of the component.

In an alternative embodiment, the transistor blocks are not arranged in a single row, but rather parallel to one another in four columns, that is to say orthogonally with respect to the associated interconnect end portions—the geometrical shape of the interconnect structure largely remaining unchanged. The latter realizes a gate or base connection of the transistor in the two embodiments.

In the case of the row arrangement, drain or collector connections are provided opposite the gate/base connections. In the case of the column arrangement mentioned last, connection points for a drain or collector connection of the integrated RF power transistor are advantageously provided between the transistor blocks arranged in columns. This configuration enables the collector to be connected up more uniformly and hence an expedient limitation of the overall dimensions.

Since, in an integrated circuit of the type proposed, the thickness of the interconnect portions is prescribed by the metallization layer thicknesses, the advantageous variation of the lead cross section with respect to the connections is to be realized by a suitable choice of the width of the respective interconnect portion. In this case, with current technologies it can be assumed that the width of the interconnect end portions and optional interconnect intermediate portions for achieving the predetermined geometrical asymmetry in one embodiment lies within the range of between 3 μm and 15 μm, preferably between 5 μm and 10 μm.

Figure 5:
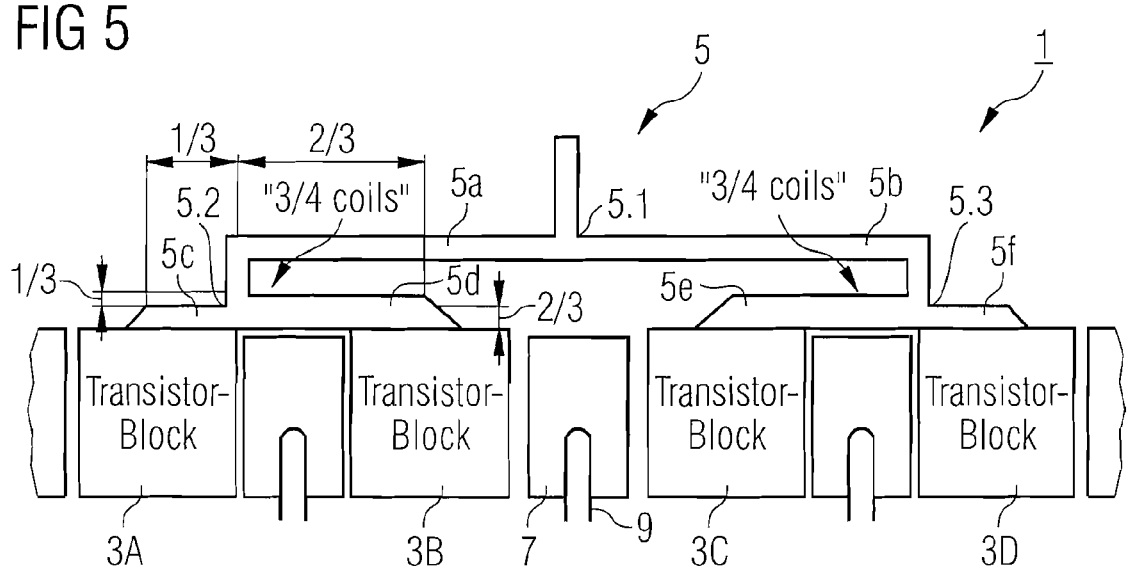
FIG. 5 shows a schematic illustration of an exemplary embodiment of the invention, in the manner of a plan view of an RF power transistor in block structure with associated connections.

FIG. 5 shows, in a schematic illustration, an RF power transistor 1 of an RF output stage, said transistor having a transistor cell construction subdivided into four transistor blocks 3A to 3D, with the end portion of an associated gate connection interconnect 5. Furthermore, the illustration schematically shows connection zones 7 with associated bonding wire ends 9 for realizing further connections (emitter/base or collector/drain). It should expressly be pointed out that the actual configuration of the last-mentioned connections and the assignment thereof depend on the respective circuit layout; moreover, what is of importance here is the basic spatial assignment to the transistor blocks 3A to 3D—namely in each case the arrangement between the latter.

The interconnect structure 5 has one first branching point 5.1 and two second branching points 5.2, 5.3. Two interconnect intermediate portions 5a and 5b respectively run mirror-symmetrically between these branching points. From the second branching point 5.2, a first interconnect end portion 5c, extends to the first transistor block 3A and a second interconnect end portion 5d extends to the second transistor block 3B, and, from the second branching point 5.3, a third interconnect end portion 5e extends to the third transistor block 3C and a fourth interconnect end portion 5f extends to the fourth transistor block 3D.

As can be discerned in the figure, the second and third interconnect end portions 5d, 5e run in close proximity parallel to a significant length portion of the interconnect intermediate portions 5a and 5b, respectively, and form with the latter in each case a three-quarter turn of a coil, that is to say a significant inductance. Since no interconnect intermediate portion is adjacent to the first and fourth interconnect end portions 5c, 5f, the latter (and therefore the connections of the first and fourth transistor blocks 3A, 3D) do not form a corresponding inductive impedance component. In the case of a configuration of the interconnect end sections with respect to the transistor blocks 3A and 3B, and respectively 3C and 3D, distinguished by geometrical symmetry, their lead end portions would therefore have differing inductive components of the complex impedance.

Therefore, as can be discerned in FIG. 5, the invention provides a geometrical asymmetry between the interconnect end portions. In the embodiment illustrated, the ratio of the lengths of the interconnect end portions 5C and 5D is 1:2, as is the ratio of the lengths of the interconnect end portions 5f and 5e. This substantially compensates for the different inductive impedance component.

Since a different nonreactive resistance component would result from the different lengths of the interconnect end portions, however, given identical conductor cross sections, in order to avoid this disadvantageous side effect the width of the second and third interconnect end portions 5d, 5e is additionally enlarged relative to that of the first and fourth interconnect end portions 5c, 5f, to be precise by a factor of 1.5

(3/2). Given a substantially constant metallization layer thickness determined by the technology, this approximately compensates for the greater lead length and produces an approximately identical resistive component of the total impedance of the leads to the individual transistor blocks. In these considerations, the capacitive component does not have to be taken into account as prime concern on account of the geometrical conditions of the connection configuration; it is taken into consideration by virtue of the abovementioned length dimensioning of the interconnect end portions for compensating for the different inductive components.

Figure 6:
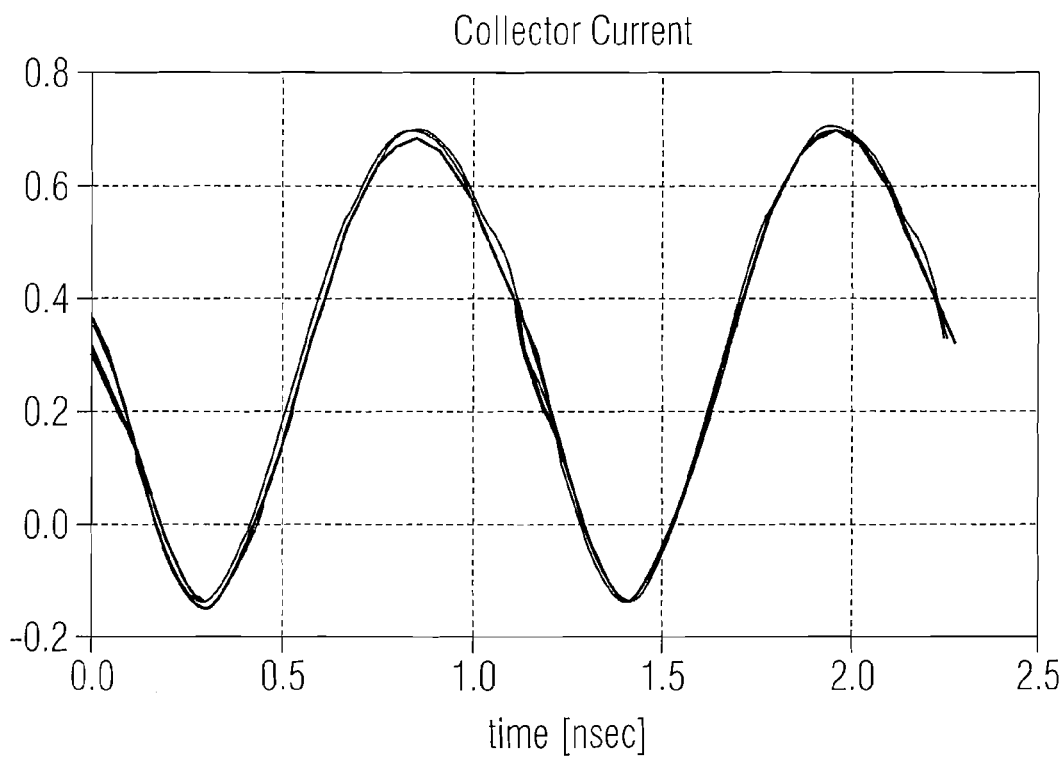
FIG. 6 shows a graphical representation corresponding to FIGS. 1 and 3 for the exemplary embodiment according to FIG. 5.

The measurement of the time dependence of the collector current in response to a sinusoidal signal, the results of which are illustrated in FIG. 6 for the four transistor blocks 3A to 3D, shows the usefulness of the proposed geometrical configuration of the interconnect end portions by virtue of the virtually ideally sinusoidal and coincident profile of the curves illustrated.

Figure 7:
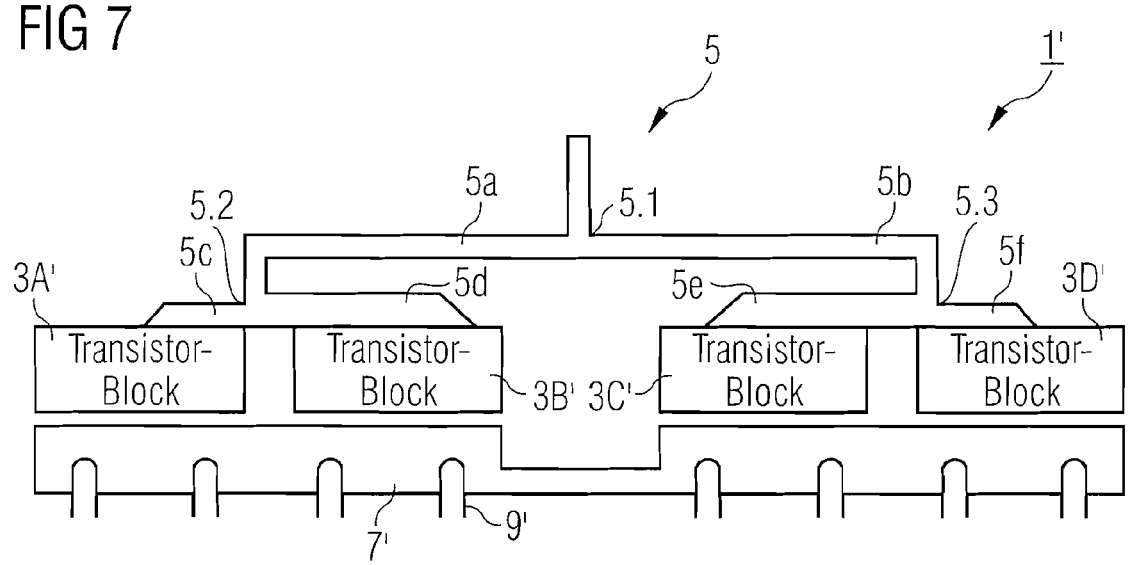
FIG. 7 shows a schematic illustration of a further exemplary embodiment of the invention, in the manner of a plan view of an RF power transistor in block structure with associated connections.

FIG. 7 illustrates a transistor/connection configuration 1' modified relative to FIG. 5 according to an alternative embodiment. Since the configuration largely matches the first embodiment shown in FIG. 5, reference numerals corresponding thereto were chosen, and the corresponding parts and sections—in particular the interconnect structure 5 with respect to the gate connection—will not be described again here.

One difference is in the lining up or alignment—which has been rotated through 90° relative to the arrangement according to FIG. 5 and therefore transformed into a single-row arrangement—of the multiplicity of cells of the transistor into four linearly lined up blocks 3A' to 3D'. This results in an altered configuration of the connection areas 7' with the associated plurality of bonding wires 9' which follows the single-row lining up of the transistor blocks, opposite the interconnect structure 5.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A circuit arrangement, comprising:
   a plurality of type-identical and identically operated components or separate sections of a component; and
   a branched wiring structure for the interconnection of the components or component sections, which in each case comprises wiring end portions lying between a branching point comprising a common conductive node and an input of the different components or sections,
   wherein a geometrical configuration of at least a portion of the wiring end portions is configured such that a complex impedance between the branching point and each of the components are substantially identical.

2. The circuit arrangement of claim 1, wherein an asymmetry of the geometrical configuration of the wiring end portions about the common conductive node of the branching point is configured such that, for radio frequency operation of the type-identical components or component sections, an inductive component of the complex impedance at the type-identical component connections is substantially identical.

3. The circuit arrangement of claim 1, wherein each component or component section comprises an active component.

4. The circuit arrangement of claim 2, wherein at least one portion of the wiring end portions lies substantially parallel and adjacent to an intermediate wiring portion, whereby an inductance is formed from the corresponding wiring end sections and intermediate wiring sections, wherein the asymmetry of the geometrical configuration is configured such that the inductive components of the complex impedance of the different wiring end portions are substantially identical.

5. The circuit arrangement of claim 4, wherein those wiring end portions that do not run adjacent to a wiring intermediate portion are configured differently than those wiring end portions that run adjacent to a respectice wiring intermediate portion.

6. The circuit arrangement of claim 2, wherein respective conductor cross sections of wiring end portions which are shaped asymmetrically for the purpose of matching their inductive impedance components are configured differently from one another for the purpose of compensating for a resultant deviation of the nonreactive resistance due to the asymmetrical shapes.

7. The circuit arrangement of claim 1, wherein wiring end portions of two adjacent active components run from a branching point of the wiring and are configured with different lengths and wherein the longer of the wiring end portions has a larger conductor cross section than the others so that the wiring end portions of the adjacent components are inductively and resistively substantially matched to each other.

8. The circuit arrangement of claim 1, wherein the circuit arrangement comprises more than two type-identical and identically operated components or component sections and comprises a wiring structure configured with multiple branches in treelike fashion for the interconnection of their respective component or component section connections.

9. The circuit arrangement of claim 1, wherein the components or component sections comprise FETs, IGBTs, HBTs or HEMTs, or sections thereof, and wherein the wiring end portions lead to control inputs of the same.

10. An integrated circuit, comprising:
    a plurality of type-identical and identically operated active components, or separate sections of an active component; and
    a branched interconnect structure configured to interconnect the components or section, the interconnect structure comprising interconnect end portions lying between a branching point comprising a common conductive node and an input of respective components or sections,
    wherein a geometrical configuration of at least a portion of the interconnect end portions is configured such that a complex impedance between the branching point and each of the components are substantially identical.

11. The integrated circuit of claim 10, wherein an asymmetry of the geometrical configuration of the interconnect end portions about the common conductive node of the branching point is configured such that, for radio frequency operation of the type-identical components or component sections, an inductive component of the complex impedance at the type-identical component connections is substantially identical.

12. The integrated circuit of claim 10, wherein each component or component section comprises an active power RF component.

13. The integrated circuit of claim 11, wherein at least one portion of the interconnect end portions lies substantially parallel and adjacent to intermediate interconnect portions, whereby an inductance is formed from the corresponding interconnect end portions and interconnect intermediate portions, and wherein the asymmetry is configured such that the inductive components of the complex impedance of the different interconnect end portions are substantially identical.

14. The integrated circuit of claim 13, wherein those interconnect end portions that do not run adjacent to an interconnect intermediate portion are configured differently from those interconnect end portions that run adjacent to an interconnect intermediate portion.

15. The integrated circuit of claim 10, wherein conductor cross sections of interconnect end portions that are shaped asymmetrically for the purpose of matching their inductive impedance components are configured differently from one another for the purpose of compensating for a resultant deviation of the nonreactive resistance due to the asymmetrical shapes.

16. The integrated circuit of claim 10, wherein interconnect end portions of two adjacent active components run from a branching point of the interconnect and are configured with different lengths, and wherein the longer of the interconnect end portions has a larger conductor cross section than the other so that the interconnect end portions of the adjacent components are substantially inductively and resistively matched to each other.

17. The integrated circuit of claim 10, wherein the integrated circuit comprises more than two type-identical and identically operated components or component sections and has an interconnect structure comprising multiple branches in treelike fashion configured to interconnect the respective component connections.

18. The integrated circuit of claim 12, wherein the active components comprise FETs, IGBTs, HBTs or HEMTs, or sections thereof, and the interconnect end portions lead to control inputs of the same.

19. The integrated circuit of claim 18, wherein the separate sections comprise transistor blocks of an integrated RF power transistor.

20. The integrated circuit of claim 19, wherein the transistor blocks comprise four transistor blocks arranged in a geometrically type-identical configuration in a row alongside one another, and the interconnect structure has at least a first and second branching point and a corner point lying therebetween, wherein an interconnect intermediate portion runs between the first branching point and the corner point and interconnect end portions run between the second branching point and the component connections, at least one of which interconnect end portions runs parallel to its respective interconnect intermediate portion and forms a mutual inductance with the latter, and also a further interconnect portion between the corner point and second branching point during operation of the component.

21. The integrated circuit of claim 19, wherein the transistor blocks comprise four transistor blocks arranged in a geometrically type-identical configuration parallel to one another in four columns on a substrate, and the interconnect structure has at least a first and second branching point and a corner point lying therebetween, wherein an interconnect intermediate portion runs between the first branching point and the corner point and interconnect end portions run between the second branching point and the component connections, at least one of which interconnect end portions runs parallel to its respective interconnect intermediate portion and forms a mutual inductance with the latter, and also a further interconnect portion between the corner point and second branching point during operation of the component.

22. The integrated circuit of claim 21, wherein the branched interconnect structure comprises a gate or base connection of the integrated RF power transistor.

23. The integrated circuit of claim 21, wherein connection points for a drain or collector connection of the integrated RF power transistor are provided between the transistor blocks arranged in columns.

* * * * *